United States Patent
Liu et al.

(10) Patent No.: US 9,379,072 B2
(45) Date of Patent: Jun. 28, 2016

(54) CHIP PACKAGE AND METHOD FOR FORMING THE SAME

(71) Applicant: XINTEC INC., Jhongli, Taoyuan County (TW)

(72) Inventors: Chien-Hung Liu, New Taipei (TW); Ying-Nan Wen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/552,186

(22) Filed: Nov. 24, 2014

(65) Prior Publication Data

US 2015/0145094 A1    May 28, 2015

Related U.S. Application Data

(60) Provisional application No. 61/909,716, filed on Nov. 27, 2013.

(51) Int. Cl.
| | |
|---|---|
| *H01L 31/00* | (2006.01) |
| *H01L 23/00* | (2006.01) |
| *H01L 25/00* | (2006.01) |
| *H01L 27/146* | (2006.01) |

(52) U.S. Cl.
CPC ............... *H01L 24/09* (2013.01); *H01L 24/05* (2013.01); *H01L 24/24* (2013.01); *H01L 24/73* (2013.01); *H01L 24/92* (2013.01); *H01L 24/94* (2013.01); *H01L 25/50* (2013.01); *H01L 27/1464* (2013.01); *H01L 27/1469* (2013.01); *H01L 27/14618* (2013.01); *H01L 27/14634* (2013.01); *H01L 27/14636* (2013.01); *H01L 24/13* (2013.01); *H01L 24/32* (2013.01); *H01L 24/82* (2013.01); *H01L 24/83* (2013.01); *H01L 2224/02371* (2013.01); *H01L 2224/02372* (2013.01); *H01L 2224/0401* (2013.01); *H01L 2224/05548* (2013.01); *H01L 2224/131* (2013.01); *H01L 2224/13022* (2013.01); *H01L 2224/13024* (2013.01);

(Continued)

(58) Field of Classification Search
CPC ................ H01L 2224/023; H01L 2224/0231; H01L 2224/08145; H01L 2224/80001; H01L 2224/8385; H01L 24/09; H01L 24/32; H01L 24/83; H01L 25/18; H01L 25/50; H01L 27/14618; H01L 27/14634; H01L 27/14636; H01L 27/1464; H01L 27/1469; H01L 2924/14335
USPC ......... 257/459, 686, 700, 777, 460, 433, 774; 438/455
See application file for complete search history.

(56) References Cited

U.S. PATENT DOCUMENTS

| | | | | |
|---|---|---|---|---|
| 2003/0107119 A1* | 6/2003 | Kim | ................... | H01L 21/76898 257/686 |
| 2007/0235882 A1* | 10/2007 | Sekiguchi | ............. | H01L 21/568 257/777 |

(Continued)

*Primary Examiner* — Mohammed Shamsuzzaman
(74) *Attorney, Agent, or Firm* — Liu & Liu (57) ABSTRACT

A chip package including a first substrate is provided. A plurality of first conductive pads is disposed on a first side of the first substrate. A second substrate is attached onto a second side opposite to the first side of the first substrate. The second substrate includes a micro-electric element and has a plurality of second conductive pads corresponding to the plurality of first conductive pads, disposed on a first side of the second substrate and between the first substrate and the second substrate. A redistribution layer is disposed on a second side opposite to the first side of the second substrate. The redistribution layer penetrates the second substrate, second conductive pads and the first substrate and extends into the first conductive pads to electrically connect the first and second conductive pads.

20 Claims, 8 Drawing Sheets

(52) U.S. Cl.
CPC ............... *H01L 2224/245* (2013.01); *H01L 2224/24051* (2013.01); *H01L 2224/24227* (2013.01); *H01L 2224/2919* (2013.01); *H01L 2224/32145* (2013.01); *H01L 2224/32225* (2013.01); *H01L 2224/73217* (2013.01); *H01L 2224/73253* (2013.01); *H01L 2224/73267* (2013.01); *H01L 2224/8203* (2013.01); *H01L 2224/8385* (2013.01); *H01L 2224/92133* (2013.01); *H01L 2224/92144* (2013.01); *H01L 2224/92244* (2013.01); *H01L 2224/94* (2013.01); *H01L 2924/10253* (2013.01); *H01L 2924/12042* (2013.01); *H01L 2924/14335* (2013.01)

(56) References Cited

U.S. PATENT DOCUMENTS

| | | | |
|---|---|---|---|
| 2009/0166840 A1* | 7/2009 | Kang | H01L 21/76898 257/686 |
| 2010/0187697 A1* | 7/2010 | Tsai | H01L 21/76898 257/773 |
| 2012/0313207 A1* | 12/2012 | Oganesian | H01L 24/19 257/433 |
| 2013/0020665 A1* | 1/2013 | Oganesian | H01L 27/14618 257/432 |
| 2015/0325557 A1* | 11/2015 | Yiu | H01L 25/16 257/414 |

* cited by examiner

CHIP PACKAGE AND METHOD FOR FORMING THE SAME

CROSS REFERENCE TO RELATED APPLICATIONS

This application claims the benefit of U.S. Provisional Application No. 61/909,716, filed on Nov. 27, 2013, the entirety of which is incorporated by reference herein.

BACKGROUND OF THE INVENTION

1. Field of the Invention

The invention relates to a chip package and methods for forming the same, and in particular to a chip package formed by a wafer-level packaging process.

2. Description of the Related Art

The chip packaging process is an important step in the fabrication of an electronic product. Chip packages not only protect the chips therein from outer environmental contaminants, but they also provide electrical connection paths between electronic elements inside and those outside of the chip packages.

Manufacturing processes of chip packages comprise dicing a wafer substrate into a plurality of chips. The chip is then disposed on a lead frame, whose size is greater than that of the chip. Next, conducting pads of the chip are electrically connected to bonding pads of the lead frame by gold wires so as to form external electrical connection paths of the chip.

However, using the gold wires and the lead frame as the external electrical connection paths costs a lot and increases the overall size of the chip package. As a result, it is difficult to further decrease the size of the chip package.

Thus, there exists a need in the art for development of a chip package and methods for forming the same capable of mitigating or eliminating the aforementioned problems.

BRIEF SUMMARY OF THE INVENTION

An embodiment of the invention provides a chip package comprising a first substrate, wherein a plurality of first conductive pads is disposed on a first side of the first substrate. A second substrate is attached onto a second side opposite to the first side of the first substrate. The second substrate comprises a micro-electric element and a plurality of second conductive pads corresponding to the plurality of first conductive pads. The plurality of second conductive pads is disposed on a first side of the second substrate and between the first substrate and the second substrate. A redistribution layer is disposed on a second side opposite to the first side of the second substrate, wherein the redistribution layer penetrates the second substrate, the plurality of second conductive pads and the first substrate. The redistribution layer extends into the plurality of first conductive pads to electrically connect the plurality of first conductive pads and the plurality of second conductive pads.

An embodiment of the invention provides a method for forming a chip package comprising providing a first substrate, wherein a plurality of first conductive pads is disposed on a first side of the first substrate. A second substrate is attached onto a second side opposite to the first side of the first substrate, wherein the second substrate comprises a micro-electric element and a plurality of second conductive pads corresponding to the plurality of first conductive pads. The plurality of second conductive pads is disposed on a first side of the second substrate and between the first substrate and the second substrate. A redistribution layer is formed on a second side opposite to the first side of the second substrate, wherein the redistribution layer penetrates the second substrate, the plurality of second conductive pads and the first substrate. The redistribution layer extends into the plurality of first conductive pads to electrically connect the plurality of first conductive pads and the plurality of second conductive pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 1A:
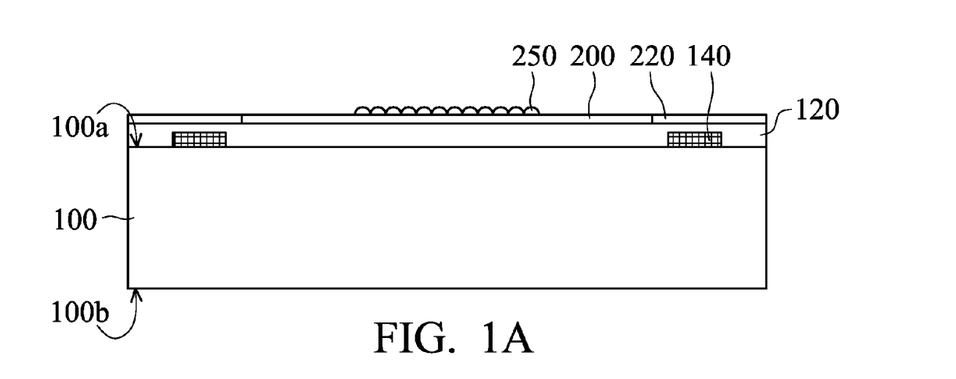
FIGS. 1A to 1G are cross-sectional views of an exemplary embodiment of a method for forming a chip package according to the invention.
Figure 1B:
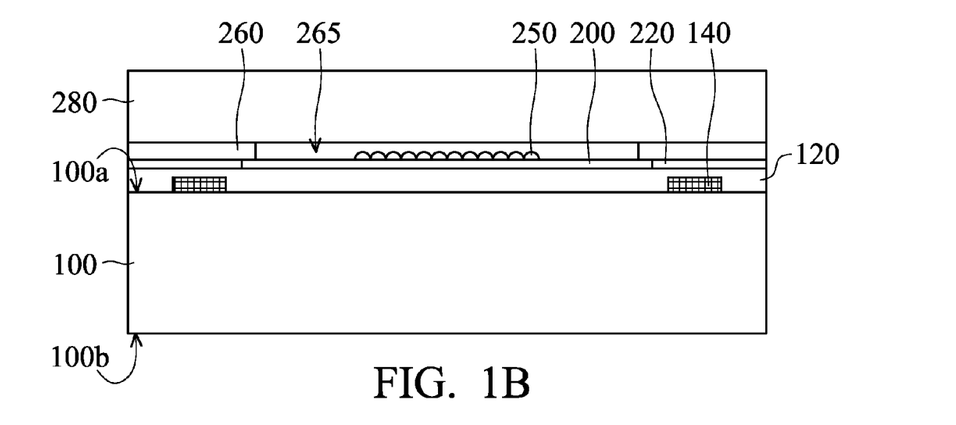
Figure 1C:
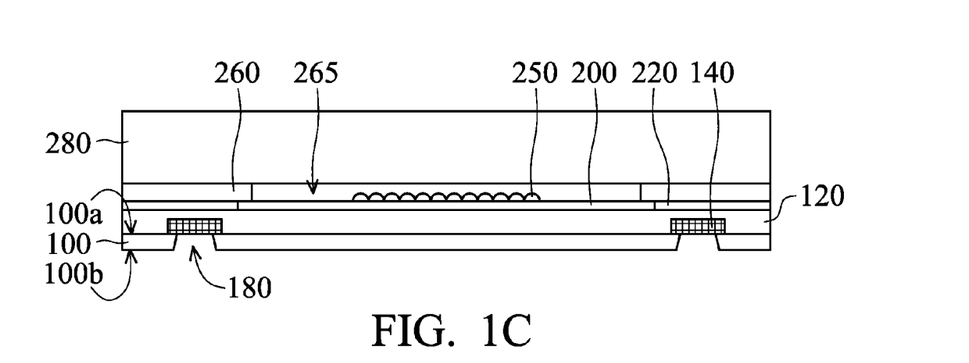
Figure 1D:
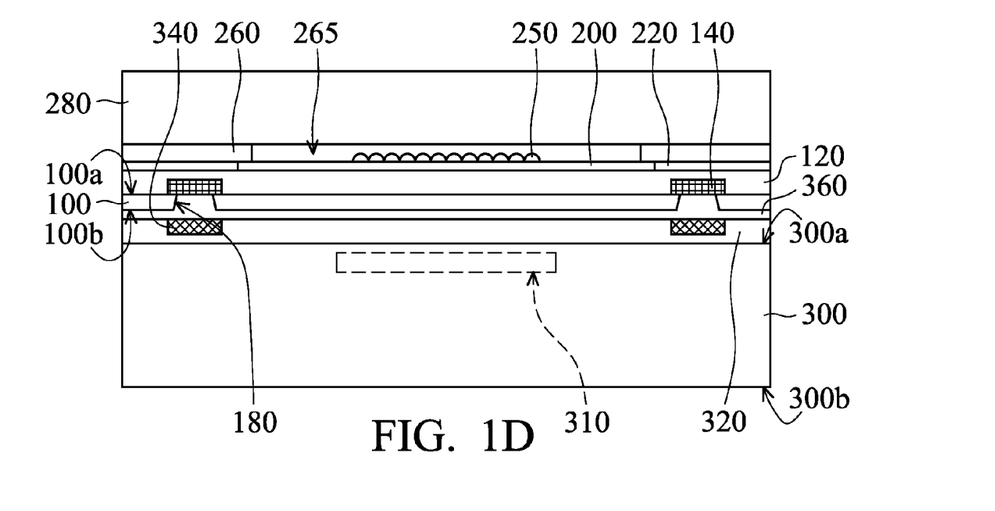
Figure 1E:
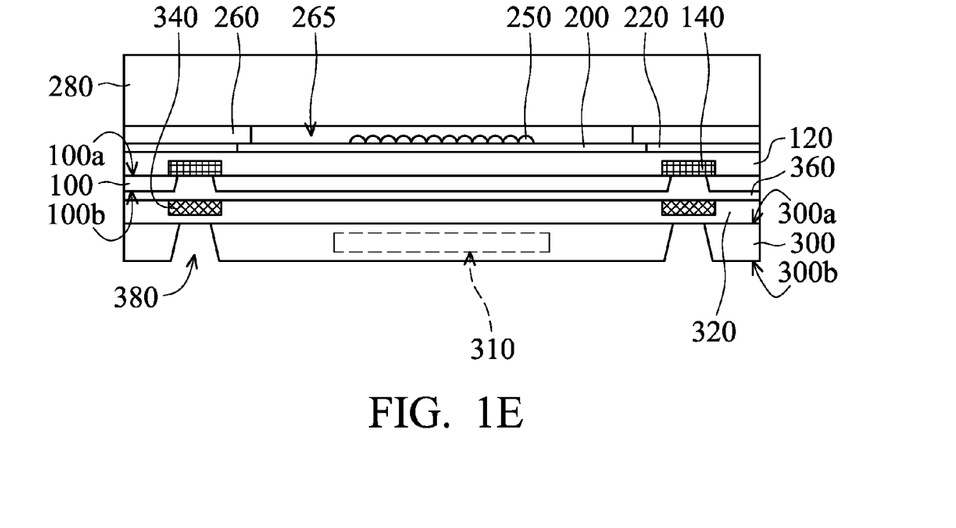
Figure 1F:
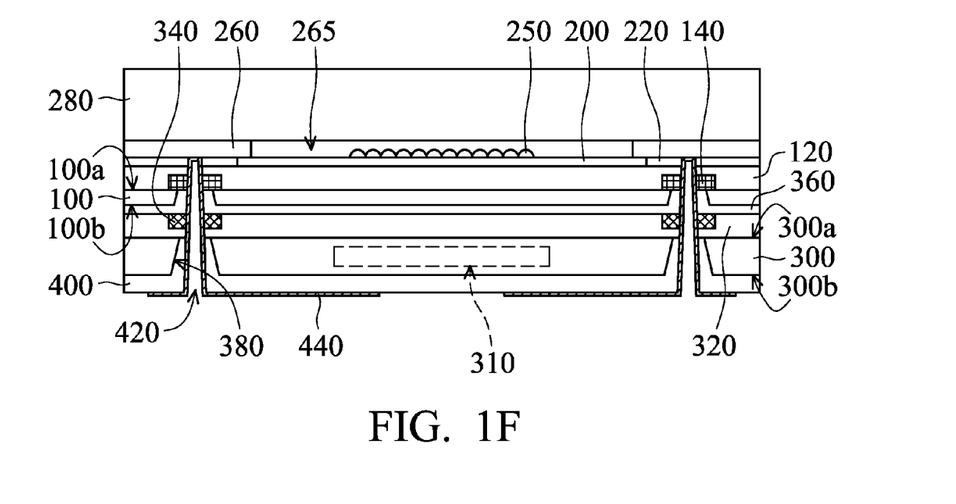
Figure 1G:
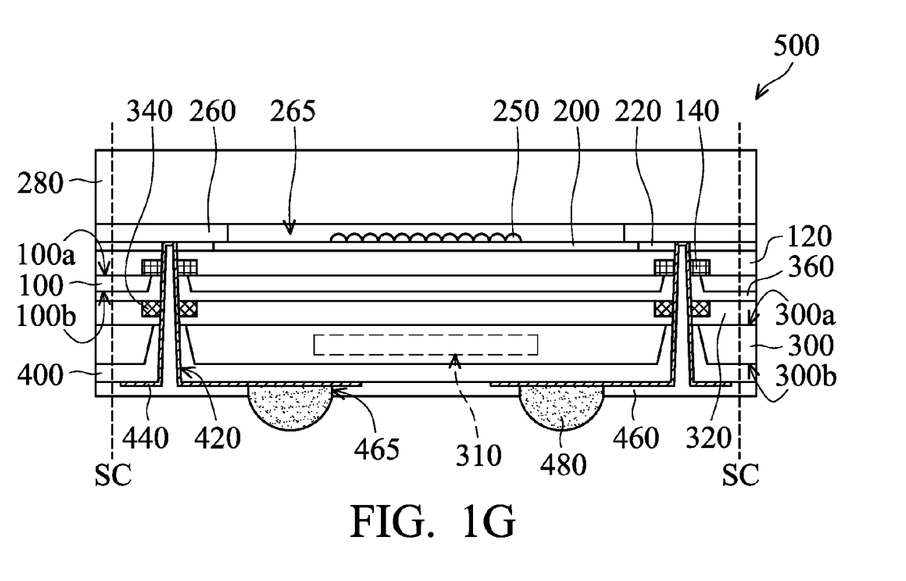

A cross-sectional view of an exemplary embodiment of a chip package 500 according to the invention is illustrated in FIG. 1G. In the embodiment, the chip package 500 comprises a first substrate 100, a second substrate 300 and a redistribution layer 440. The first substrate 100 has a first side 100a and a second side 100b opposite thereto. In the embodiment, the first substrate 100 may be composed of a raw wafer without any active element, passive element or micro-electric element therein.

The second substrate 300 is attached on the second side 100b of the first substrate 100 and has micro-electric element disposed in an electronic element region 310. In one embodiment, the micro-electric element may be a digital signal processor (DSP) or another suitable micro-electric element.

The second substrate 300 has a first side 300a and a second side 300b opposite thereto. The second substrate 300 comprises a dielectric layer 320. A plurality of second conducting pads 340 is disposed in the dielectric layer 320. The second conducting pads 340 are located on the first side 300a of the second substrate 300 and between first substrate 100 and the second substrate 300. In the embodiment, the second substrate 300 comprises a plurality of openings 380 (shown in FIGS. 1E and 1F), which correspond to the second conducting pads 340. In one embodiment, the second substrate 300 is a semiconductor wafer, such as a silicon wafer, so as to facilitate the wafer-level packaging process. In another embodiment, the second substrate 300 is a semiconductor chip. In one embodiment, the second conducting pad 340 may be a single conducting layer or comprise multiple conducting layers, and be electrically connected to the micro-electric element in the electronic element region 310 by an interconnection structure (not shown).

An adhesive layer 360 is disposed between the first substrate 100 and the dielectric layer 320 of the second substrate 300 so as to attach the second substrate 300 onto the first substrate 100. In one embodiment, the adhesive layer 360 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or other suitable insulating materials.

An insulating layer 400 is disposed on the second side 300b of the second substrate 300 and filled into the openings 380 (shown in FIGS. 1E and 1F) of the second substrate 300. In one embodiment, the insulating layer 400 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

A third substrate 200 is attached on the first side 100a of the first substrate 100 and has an optical element 250 disposed thereon. In one embodiment, the third substrate 200 comprises a back side illumination (BSI) complementary metal oxide semiconductor image sensor (CIS) element. In one embodiment, the third substrate 200 is a semiconductor wafer, such as a silicon wafer, so as to facilitate the wafer-level packaging process. In another embodiment, the third substrate 200 is a semiconductor chip. In one embodiment, the optical element 250 may be a microlens array or another optical element suitable for image sensing.

The third substrate 200 comprises a dielectric layer 120. A plurality of first conducting pads 140 is disposed in the dielectric layer 120. The first conducting pads 140 are located between the first substrate 100 and the third substrate 200 (i.e. on the first side 100a of the first substrate 100) and correspond to the second conducting pads 340. In one embodiment, the first conducting pad 140 may be a single conducting layer or comprise multiple conducting layers, and be electrically connected to the image sensor element by an interconnection structure (not shown).

In the embodiment, the first substrate 100 comprises a plurality of openings 180 (shown in FIGS. 1C and 1D), which correspondingly expose the first conducting pads 140. The adhesive layer 360 disposed between the first substrate 100 and the second substrate 300 fills into the openings 180 of the first substrate 100.

A spacer layer is disposed on the dielectric layer 120 of the third substrate 200 (i.e. on the first side 100a of the first substrate 100) and corresponds to the first conducting pads 140. The spacer layer comprises a first layer (or dam) 260 and a second layer 220. In the embodiment, each of the first layer 260 and the second layer 220 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or other suitable insulating materials.

A cover plate 280 is disposed on the dam 260. The dam 260 forms a cavity 265 between the third substrate 200 and the cover plate 280, such that the optical element 250 is located on the third substrate 200 in the cavity 265 and is protected by the cover plate 280. In the embodiment, the cover plate 280 may comprise glass or other suitable materials.

In one embodiment, a plurality of openings 420 is located in the openings 380 (shown in FIGS. 1E and 1F) of the second substrate 300 and penetrates the respective second conducting pads 340, the openings 180 (shown in FIGS. 1C and 1D) of the first substrate 100, and the respective first conducting pads 140 to extend into the second layer 220 of the spacer layer. The redistribution layer 440 is disposed on the second side 300b of the second substrate 300 and extends into the openings 420. The redistribution layer 440 penetrates the second conducting pads 340 and the first conducting pads 140 and extends into the second layer 220 of the spacer layer so as to electrically connect the second conducting pads 340 and the first conducting pads 140. As a result, the redistribution layer 440 in the openings 420 is also referred to as a through silicon via (TSV). In one embodiment, the redistribution layer 440 may comprise copper, aluminum, gold, platinum or another suitable conducting material.

In another embodiment, the openings 420 may further extend into the first layer 260 of the spacer layer, such that the redistribution layer 440 may further extend into the first layer 260 as well. In yet another embodiment, the openings 420 may penetrate the first conducting pads 140 without extending into the spacer layer, and the redistribution layer 440 may not extend into the spacer layer. In yet another embodiment, the openings 420 may further extend into the first conducting pads 140 without penetrating the first conducting pads 140, and the redistribution layer 440 may not penetrate the first conducting pads 140 either.

In the embodiment, the redistribution layer 440 is electrically connected to the first conducting pads 140 and the second conducting pads 340 and is referred to as a ring-contact. In the embodiment, the redistribution layer 440 is electrically isolated from the second substrate 300 and the first substrate 100 by the insulating layer 400 and the adhesive layer 360, respectively.

In the embodiment, the chip package 500 further comprises an insulating layer 460 (such as a passivation layer) and conducting structures 480 (such as solder balls, bumps or conducting pillars) disposed on the second side 300b of the second substrate 300. The insulating layer 460 covers the redistribution layer 440 and has a plurality of openings 465 exposing a portion of the redistribution layer 440. In one embodiment, the insulating layer 460 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

In one embodiment, the insulating layer 460 penetrates the second substrate 300, the second conducting pads 340, the first substrate 100 and the first conducting pads 140 through the openings 420 and extends into the second layer 220 of the spacer layer. In another embodiment, the insulating layer 460 may further extend into the first layer 260 of the spacer layer. In yet another embodiment, the insulating layer 460 may not extend into the spacer layer. In yet another embodiment, the insulating layer 460 may not penetrate the first conducting pads 140.

The conducting structures 480 are filled into the opening 465 of the insulating layer 460 to electrically connect to the redistribution layer 440. In one embodiment, the conducting structures 480 may comprise tin, lead, copper, gold, nickel or a combination thereof.

Figure 2A:
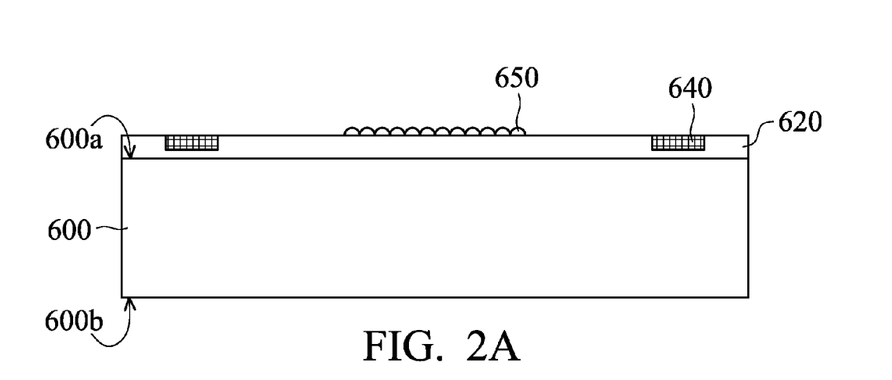
FIGS. 2A to 2G are cross-sectional views of another exemplary embodiment of a method for forming a chip package according to the invention.
Figure 2B:
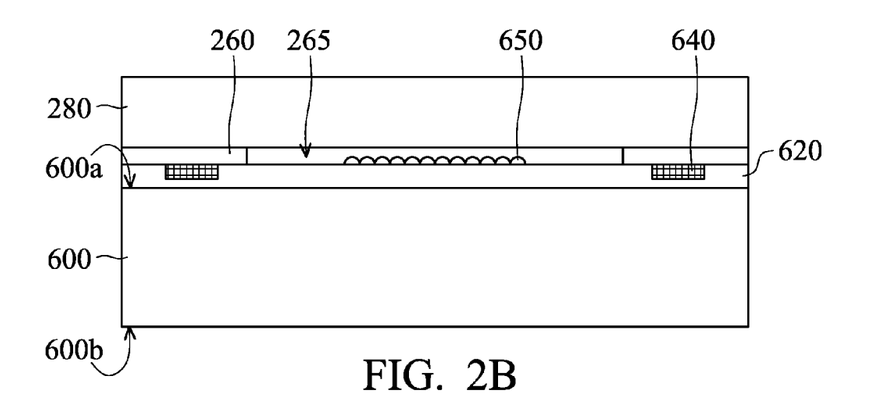
Figure 2C:
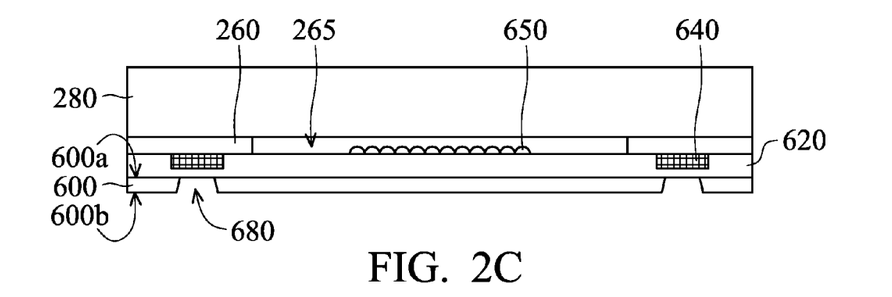
Figure 2D:
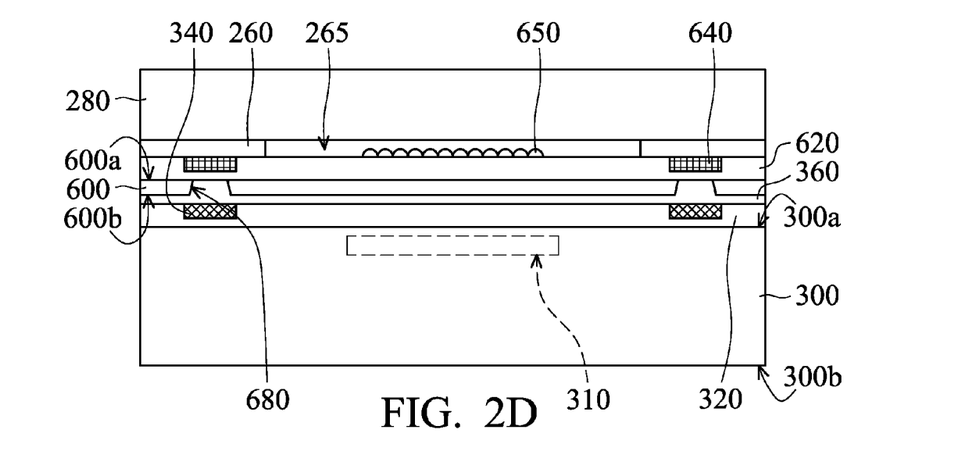
Figure 2E:
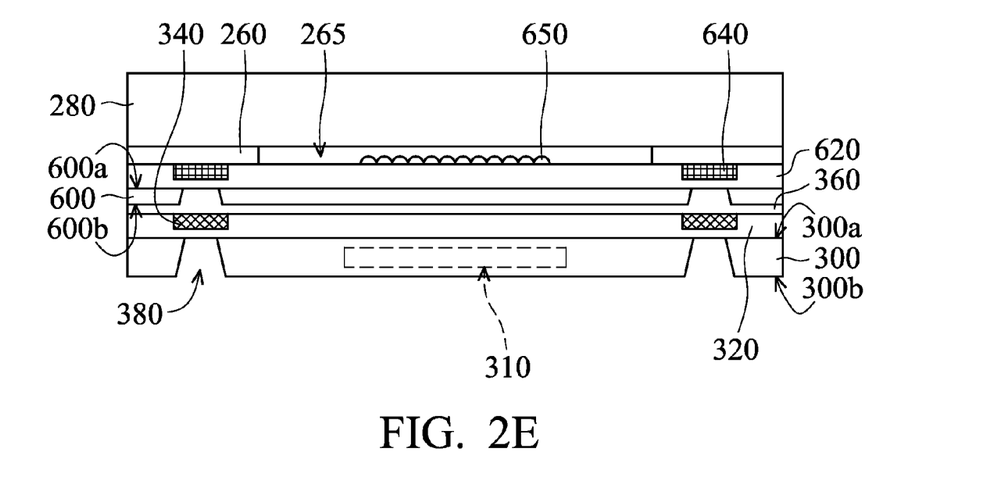
Figure 2F:
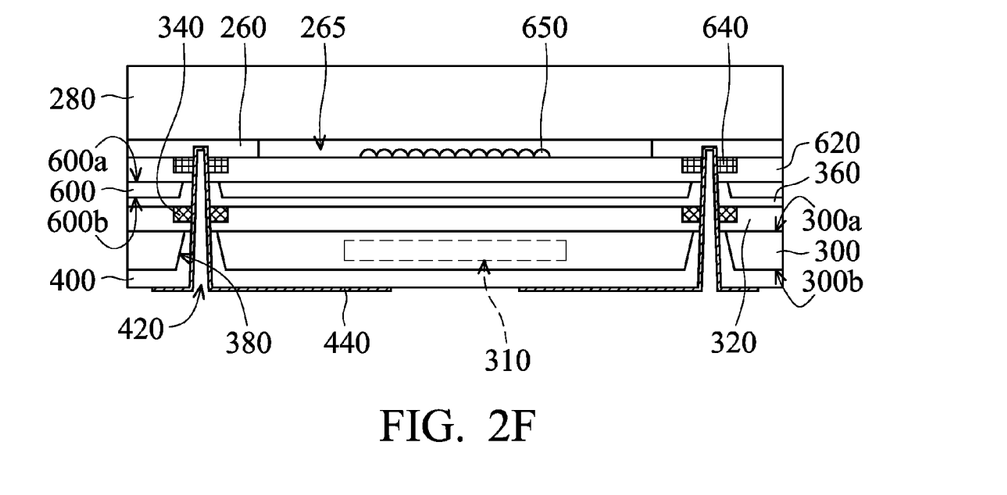
Figure 2G:
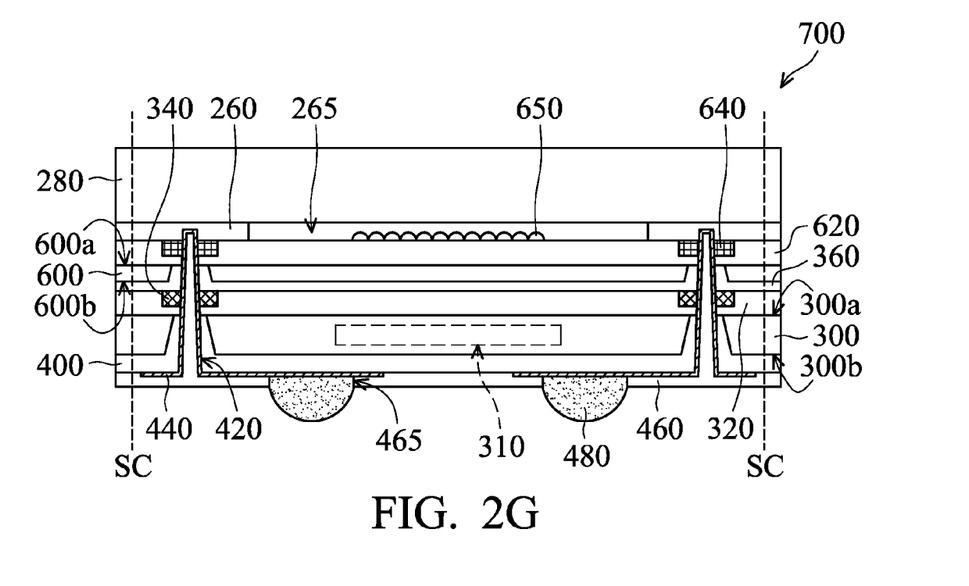

A cross-sectional view of another exemplary embodiment of a chip package 700 according to the invention is illustrated in FIG. 2G, wherein elements in FIG. 2G that are the same as those in FIG. 1G are labeled with the same reference numbers as in FIG. 1G and are not described again for brevity. In the embodiment, the chip package 700 comprises a first substrate 600, a second substrate 300 and a redistribution layer 440. The first substrate 100 of the chip package 500 shown in FIG. 1G is composed of a raw wafer without any active or passive elements therein. Unlike the first substrate 100, in the embodiment, the first substrate 600 comprises a dielectric layer 620. A plurality of first conducting pads 640 is disposed in the dielectric layer 620 and located on a first side 600a of the first substrate 600. Moreover, the first substrate 600 comprises an optical element 650 disposed on the dielectric layer 620. In one embodiment, the first substrate 600 comprises a front side illumination (FSI) complementary metal oxide semiconductor image sensor (CIS) element. In one embodiment, the first substrate 600 is a semiconductor wafer, such as a silicon wafer, so as to facilitate the wafer-level packaging process. In another embodiment, the first substrate 600 is a semiconductor chip. In one embodiment, the optical element 650 may be a microlens array or another optical element suitable for image sensing. In one embodiment, the first conducting pad 640 may be a single conducting layer or comprise multiple conducting layers, and be electrically connected to the image sensor element by an interconnection structure (not shown).

In the embodiment, the first substrate 600 comprises a plurality of openings 680 (shown in FIGS. 2C and 2D), which correspondingly expose the first conducting pads 640. The adhesive layer 360 disposed between the first substrate 600 and the second substrate 300 fills into the openings 680 of the first substrate 100.

The spacer layer of the chip package 500 shown in FIG. 1G comprises the first layer 260 and the second layer 220. Unlike the spacer layer of the chip package 500, in the embodiment, the spacer layer of the chip package 700 is composed of a dam 260. The dam 260 is disposed on the dielectric layer 620 of the first substrate 600 (i.e. on the first side 600a of the first substrate 600) and corresponds to the first conducting pads 640. A cover plate 280 is disposed on the dam 260. The dam 260 forms a cavity 265 between the first substrate 600 and the cover plate 280, such that the optical element 650 is located on the first substrate 600 in the cavity 265 and is protected by the cover plate 280.

In the embodiment, the redistribution layer 440 of the chip package 700 penetrates the second substrate 300, the second conducting pads 340, the first substrate 600 and the first conducting pads 640 through the openings 420 and extends into the dam 260. In another embodiment, the redistribution layer 440 may penetrate the first conducting pads 640 without extending into the dam 260. In yet another embodiment, the redistribution layer 440 may extend into the first conducting pads 640 without penetrating the first conducting pads 640.

According to the aforementioned embodiments, the complementary metal oxide semiconductor image sensor (CIS) and the digital signal processor (DSP) are vertically stacked. Moreover, the openings 420 penetrate the second substrate 300, the respective second conducting pads 340 and the first substrate 100/600 to extend into the respective first conducting pads 140/640. As a result, the CIS and DSP can be electrically connected to each other by the redistribution layer 440 extending into the openings 420. Moreover, the through silicon via (i.e. the redistribution layer 440), rather than the wires and the lead frame, is used as the external electrical connection path of the chip package, the processing cost is lowered, and the size of the chip package, which combines the CIS and DSP, can be reduced further.

An exemplary embodiment of a method for forming a chip package according to the invention is illustrated in FIGS. 1A to 1G, in which FIGS. 1A to 1G are cross-sectional views of an exemplary embodiment of a method for forming a chip package 500 according to the invention.

Referring to FIG. 1A, a first substrate 100 having a first side 100a and a second side 100b opposite thereto is provided. In the embodiment, the first substrate 100 may be composed of a raw wafer without any active element, passive element or micro-electric element therein.

A third substrate 200 is attached on the first side 100a of the first substrate 100 and has an optical element 250 disposed thereon. In one embodiment, the third substrate 200 comprises a back side illumination complementary metal oxide semiconductor image sensor element. In one embodiment, the third substrate 200 is a semiconductor wafer, such as a silicon wafer, so as to facilitate the wafer-level packaging process. In one embodiment, the optical element 250 may be a microlens array or another optical element suitable for image sensing.

The third substrate 200 comprises a dielectric layer 120. A plurality of first conducting pads 140 is disposed in the dielectric layer 120. The first conducting pads 140 are located between the first substrate 100 and the third substrate 200 (i.e. on the first side 100a of the first substrate 100). In one embodiment, the first conducting pad 140 may be a single conducting layer or comprise multiple conducting layers, and be electrically connected to the image sensor element by an interconnection structure (not shown).

A spacer layer is disposed on the dielectric layer 120 of the third substrate 200 (i.e. on the first side 100a of the first substrate 100) and corresponds to the first conducting pads 140. In the embodiment, the spacer layer may comprise a first layer (or dam) 260 and a second layer 220 on the dielectric layer 120, wherein the first layer 260 is located on the second layer 220, as shown in FIG. 1B. In one embodiment, the second layer 220 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or other suitable insulating materials.

The first layer 260 may be formed on the third substrate 200 by a deposition process (such as a coating process, a physical vapor deposition process, a chemical vapor deposition process or another suitable process), and correspond to the first conducting pads 140. In the embodiment, the first layer 260 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

Next, a cover plate 280 is provided on the dam 260 to form a cavity 265 between the third substrate 200 and the cover plate 280, such that the optical element 250 is located on the third substrate 200 in the cavity 265 and is protected by the cover plate 280. In the embodiment, the cover plate 280 may comprise glass or other suitable materials.

Referring to FIG. 1C, the cover plate 280 is used as a carrier substrate, and a thinning process, such as an etching process, a milling process, a grinding process or a polishing process, is performed on the surface of the first substrate 100 on the second side 100b to decrease the thickness of the first substrate 100.

Next, a plurality of openings 180 may be formed in the first substrate 100 by lithography and etching processes (the etching process may comprise a dry etching process, a wet etching process, a plasma etching process, a reactive ion etching process or another suitable process) to correspondingly expose the first conducting pad 140.

Referring to FIG. 1D, an adhesive layer 360 is formed on the second side 100b of the first substrate 100 by a deposition process (such as a coating process, a physical vapor deposition process, a chemical vapor deposition process or another suitable process), and is filled into the openings 180 of the first substrate 100. In one embodiment, the adhesive layer 360 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or other suitable insulating materials.

Next, a second substrate 300 is attached onto the second side 100b of the first substrate 100 by the adhesive layer 360. The second substrate 300 has micro-electric element disposed in an electronic element region 310. In one embodiment, the micro-electric element may be a digital signal processor (DSP) or another suitable micro-electric element. The second substrate 300 has a first side 300a and a second side 300b opposite thereto. The second substrate 300 comprises a dielectric layer 320. A plurality of second conducting pads 340 is disposed in the dielectric layer 320 and corresponds to the first conducting pads 140. The second conducting pads 340 are located on the first side 300a of the second substrate 300 and between first substrate 100 and the second substrate 300.

Referring to FIG. 1E, the cover plate 280 is used as a carrier substrate, and a thinning process, such as an etching process, a milling process, a grinding process or a polishing process, is performed on the surface of the second substrate 300 on the second side 300b to decrease the thickness of the second substrate 300.

Next, a plurality of openings 380 may be formed in the second substrate 300 by lithography and etching processes (the etching process may comprise a dry etching process, a wet etching process, a plasma etching process, a reactive ion etching process or another suitable process) and correspond to the second conducting pad 340. In one embodiment, the second substrate 300 is a semiconductor wafer, such as a silicon wafer, so as to facilitate the wafer-level packaging process. In one embodiment, the second conducting pad 340 may be a single conducting layer or comprise multiple conducting layers, and be electrically connected to the microelectric element in the electronic element region 310 by an interconnection structure (not shown).

Referring to FIG. 1F, an insulating layer 400 may be formed on the second side 300b of the second substrate 300 by a deposition process (such as a coating process, a physical vapor deposition process, a chemical vapor deposition process or another suitable process), and filled into the openings 380 of the second substrate 300. In one embodiment, the insulating layer 400 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

Next, an opening 420 may be formed in the insulating layer 400 in each opening 380 (shown in FIGS. 1E and 1F) by a laser drilling process, an etching process (such as a dry etching process, a wet etching process, a plasma etching process or a reactive ion etching process) or another suitable process.

Next, a patterned redistribution layer 440 may be formed on the second side 300b of the second substrate 300 by a deposition process (such as a coating process, a chemical vapor deposition process, a physical vapor deposition process, an electroplating process, an electroless plating process or another suitable process) and lithography and etching processes. The redistribution layer 440 extends into the openings 420. In one embodiment, the redistribution layer 440 may comprise copper, aluminum, gold, platinum or another suitable conducting material.

In one embodiment, the openings 420 penetrate the respective second conducting pads 340, the openings 180 (shown in FIGS. 1C and 1D) of the first substrate 100, and the respective first conducting pads 140 to extend into the second layer 220 of the spacer layer. As a result, the redistribution layer 440 also penetrates the respective second conducting pads 340 and the respective first conducting pads 140 and extends into the second layer 220 of the spacer layer so as to electrically connect the second conducting pads 340 and the first conducting pads 140.

In another embodiment, the openings 420 may further extend into the first layer 260 of the spacer layer, such that the redistribution layer 440 may further extend into the first layer 260 as well. In yet another embodiment, the openings 420 may penetrate the first conducting pads 140 without extending into the spacer layer, and the redistribution layer 440 may not extend into the spacer layer. In yet another embodiment, the openings 420 may further extend into the first conducting pads 140 without penetrating the first conducting pads 140, and the redistribution layer 440 may not penetrate the first conducting pads 140 either.

In the embodiment, the redistribution layer 440 is electrically connected to the first conducting pads 140 and the second conducting pads 340 and is referred to as a ring-contact. In the embodiment, the redistribution layer 440 is electrically isolated from the second substrate 300 and the first substrate 100 by the insulating layer 400 and the adhesive layer 360, respectively.

Referring to FIG. 1G, an insulating layer 460 (such as a passivation layer) may be formed on the second side 300b of the second substrate 300 by a deposition process to cover the redistribution layer 440. In one embodiment, the insulating layer 460 is filled into the openings 420 to penetrate the second substrate 300, the respective second conducting pads 340, the first substrate 100 and the respective first conducting pads 140 and extend into the second layer 220 of the spacer layer. In another embodiment, the insulating layer 460 may further extend into the first layer 260 of the spacer layer. In yet another embodiment, the insulating layer 460 may not extend into the spacer layer. In yet another embodiment, the insulating layer 460 may not penetrate the first conducting pads 140. In one embodiment, the insulating layer 460 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

Next, openings 465 may be formed in the insulating layer 460 by lithography and etching processes to expose a portion of the patterned redistribution layer 440. Next, conducting structures 480 (such as solder balls, bumps or conducting pillars) are filled into the openings 465 of the insulating layer 460 to electrically connect the patterned redistribution layer 440. For example, solder may be formed in the openings 465 of the insulating layer 460 by a plating process, a screen printing process or another suitable process, and a reflow process is then performed to form the conducting structures 480. In one embodiment, the conducting structures 480 may comprise tin, lead, copper, gold, nickel or a combination thereof. Next, the second substrate 300, the first substrate 100 and the cover plate 280 are diced along scribe lines SC to form a plurality of independent chip packages 500.

Another exemplary embodiment of a method for forming a chip package according to the invention is illustrated in FIGS. 2A to 2G, in which FIGS. 2A to 2G are cross-sectional views of another exemplary embodiment of a method for forming a chip package 700 according to the invention. Elements in FIGS. 2A to 2G that are the same as those in FIGS. 1A to 1G are labeled with the same reference numbers as in FIGS. 1A to 1G and are not described again for brevity.

Referring to FIG. 2A, a first substrate 600 having a first side 600a and a second side 600b opposite thereto is provided. In the embodiment, the first substrate 600 comprises a dielectric layer 620. A plurality of first conducting pads 640 is disposed in the dielectric layer 620 and located on the first side 600a of the first substrate 600. Moreover, the first substrate 600 comprises an optical element 650 disposed on the dielectric layer 620. In one embodiment, the first substrate 600 comprises a front side illumination complementary metal oxide semiconductor image sensor element. In one embodiment, the first substrate 600 is a semiconductor wafer, such as a silicon wafer, so as to facilitate the wafer-level packaging process. In one embodiment, the optical element 650 may be a microlens array or another optical element suitable for image sensing. In one embodiment, the first conducting pad 640 may be a single conducting layer or comprise multiple conducting layers, and be electrically connected to the image sensor element by an interconnection structure (not shown).

Referring to FIG. 2B, a dam 260 may be formed on the dielectric layer 620 of the first substrate 600 (i.e. on the first side 600a of the first substrate 600) by the same or a similar step as that shown in FIG. 1B. The dam 260 corresponds to the first conducting pads 640. Next, a cover plate 280 is provided on the dam 260 to form a cavity 265 between the first substrate 600 and the cover plate 280, such that the optical element 250 is located on the first substrate 600 in the cavity 265 and is protected by the cover plate 280.

Referring to FIGS. 2C to 2E, the first substrate 600 may be thinned and a plurality of openings 680 may be formed therein to correspondingly expose the first conducting pads 640 by the same or a similar steps as that shown in FIGS. 1C to 1E, as shown in FIG. 2C. Next, an adhesive layer 360 may be formed on the second side 600b of the first substrate 600, and filled into the openings 680 of the first substrate 600. A second substrate 300 is attached onto the second side 600b of the first substrate 600 by the adhesive layer 360, as shown in FIG. 2D. After the second substrate 300 is thinned, a plurality of openings 380 corresponding to the second conducting pads 340 is formed in the second substrate 300, as shown in FIG. 2E.

The second substrate 300 has micro-electric element disposed in an electronic element region 310. In one embodiment, the micro-electric element may be a digital signal processor (DSP) or another suitable micro-electric element.

Referring to FIG. 2F, an insulating layer 400, openings 420, and a patterned redistribution layer 440 which is filled into the openings 420, may be sequentially formed on the second side 300b of the second substrate 300 by the same or similar steps as that shown in FIG. 1F. Next, an insulating layer 460, which comprises a plurality of openings 465, and conducting structures 480, which are filled into the openings 465, may be sequentially formed by the same or similar steps as that shown in FIG. 1G. The second substrate 300, the first substrate 600 and the cover plate 280 are then diced along the scribe lines SC to form a plurality of independent chip packages 700, as shown in FIG. 2G.

In the embodiment, the redistribution layer 440 penetrates the second substrate 300, the second conducting pads 340, the first substrate 600 and the first conducting pads 640 through the openings 420 and extends into the dam 260. In another embodiment, the redistribution layer 440 may penetrate the first conducting pads 640 without extending into the dam 260. In yet another embodiment, the redistribution layer 440 may extend into the first conducting pads 640 without penetrating the first conducting pads 640.

According to the aforementioned embodiments, the complementary metal oxide semiconductor image sensor (CIS) and the digital signal processor (DSP) are vertically stacked. Since the openings 420 are formed by a laser drilling process so as to penetrate the second substrate 300, the second conducting pads 340 and the first substrate 100/600, thereby extending into the first conducting pads 140/640, the CIS and DSP can be electrically connected to each other by the redistribution layer 440 extending into the openings 420, rather than wires. Therefore, the size of the chip package, which combines the CIS and DSP, can be reduced further, and the processing cost is also reduced. In addition, forming chip packages by wafer-level packaging can produce massive chip packages, thereby significantly reducing the processing cost and time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a first substrate, wherein a plurality of first conductive pads are disposed on a first side of the first substrate;

a second substrate attached onto a second side opposite to the first side of the first substrate, wherein the second substrate comprises a micro-electric element, a dam and a plurality of second conductive pads corresponding to the plurality of first conductive pads, and wherein the plurality of second conductive pads are disposed on a first side of the second substrate and between the first substrate and the second substrate;

an opening penetrating the second substrate, the plurality of second conductive pads and the first substrate to extend into the plurality of first conductive pads;

a redistribution layer disposed on a second side opposite to the first side of the second substrate, wherein the redistribution layer penetrates the second substrate, the plurality of second conductive pads and the first substrate and extends into the plurality of first conductive pads to electrically connect the plurality of first conductive pads and the plurality of second conductive pads, wherein the redistribution layer is formed on sidewalls and a bottom of the opening, without completely filling the opening and without extending into the dam; and an insulating layer disposed on the second side of the second substrate to cover the redistribution layer, wherein the insulating layer penetrates the second substrate, the plurality of second conductive pads and the first substrate to extend into the plurality of first conductive pads, wherein the insulating layer further extends to penetrate the plurality of first conductive pads.

2. The chip package as claimed in claim 1, wherein the redistribution layer further extends to penetrate the plurality of first conductive pads.

3. The chip package as claimed in claim 1, wherein the first substrate is a raw wafer.

4. The chip package as claimed in claim 3, further comprising an image sensing device disposed on the first side of the first substrate, wherein the micro-electric element is a digital signal processor.

5. The chip package as claimed in claim 1, further comprising:
 a third substrate above the first side of the first substrate, wherein the micro-electric element is a digital signal processor; and
 an optical element disposed on the third substrate.

6. The chip package as claimed in claim 3, further comprising:
 an adhesive layer attaching the second substrate to the first substrate; and
 an insulating layer disposed on the second side of the second substrate.

7. The chip package as claimed in claim 6, wherein the redistribution layer penetrates the adhesive layer and the insulating layer.

8. The chip package as claimed in claim 1, further comprising a spacer layer disposed on the first side of the first substrate, wherein the redistribution layer further extends into the spacer layer.

9. A chip package, comprising:
 a first substrate, wherein a plurality of first conductive pads are disposed on a first side of the first substrate;
 a second substrate attached onto a second side opposite to the first side of the first substrate, wherein the second substrate comprises a micro-electric element, a dam and a plurality of second conductive pads corresponding to the plurality of first conductive pads, and wherein the plurality of second conductive pads are disposed on a first side of the second substrate and between the first substrate and the second substrate;

a redistribution layer disposed on a second side opposite to the first side of the second substrate, wherein the redistribution layer penetrates the second substrate, the plurality of second conductive pads and the first substrate and extends into the plurality of first conductive pads to electrically connect the plurality of first conductive pads and the plurality of second conductive pads without extending into the dam; and an insulating layer disposed on the second side of the second substrate to cover the redistribution layer, wherein the insulating layer penetrates the second substrate, the plurality of second conductive pads and the first substrate to extend into the plurality of first conductive pads, and wherein the insulating layer further extends to penetrate the plurality of first conductive pads.

10. A method for forming a chip package, comprising:
 providing a first substrate, wherein a plurality of first conductive pads are disposed on a first side of the first substrate;
 attaching a second substrate onto a second side opposite to the first side of the first substrate, wherein the second substrate comprises a micro-electric element, a dam and a plurality of second conductive pads corresponding to the plurality of first conductive pads, and wherein the plurality of second conductive pads are disposed on a first side of the second substrate and between the first substrate and the second substrate;
 forming an opening penetrating the second substrate, the plurality of second conductive pads and the first substrate to extend into the plurality of first conductive pads;
 forming a redistribution layer on a second side opposite to the first side of the second substrate, wherein the redistribution layer penetrates the second substrate, the plurality of second conductive pads and the first substrate and extends into the plurality of first conductive pads to electrically connect the plurality of first conductive pads and the plurality of second conductive pads, wherein the redistribution layer is formed on sidewalls and a bottom of the opening without completely filling the opening and without extending into the dam; and
 forming an insulating layer disposed on the second side of the second substrate to cover the redistribution layer, wherein the insulating layer penetrates the second substrate, the plurality of second conductive pads and the first substrate to extend into the plurality of first conductive pads, wherein the insulating layer further extends to penetrate the plurality of first conductive pads.

11. The method as claimed in claim 10, wherein the redistribution layer further extends to penetrate the plurality of first conductive pads.

12. The method as claimed in claim 10, wherein the first substrate is a raw wafer.

13. The method as claimed in claim 12, further comprising disposing an image sensing device on the first side of the first substrate, wherein the micro-electric element is a digital signal processor.

14. The method as claimed in claim 10, wherein an image sensing device is disposed on the first substrate and the micro-electric element is a digital signal processor.

15. The method as claimed in claim 10, wherein the second substrate is attached onto the first substrate by an adhesive layer.

16. The method as claimed in claim 15, further comprising:
 forming an insulating layer on the second side of the second substrate before the redistribution layer is formed, wherein the opening penetrates the insulating layer and the adhesive layer, and wherein the redistribution layer extends into the opening to penetrate the adhesive layer.

17. The method as claimed in claim 16, wherein the opening is formed by a laser drilling process.

18. The method as claimed in claim 10, further comprising forming a spacer layer on the first side of the first substrate, wherein the redistribution layer further extends into the spacer layer.

19. The method as claimed in claim 10, further comprising forming an insulating layer on the second side of the second substrate to cover the redistribution layer, wherein the insulating layer penetrates the second substrate, the plurality of second conductive pads and the first substrate to extend into the plurality of first conductive pads.

20. A method for forming a chip package, comprising:
provi­ding a first substrate, wherein a plurality of first conductive pads are disposed on a first side of the first substrate;
attaching a second substrate onto a second side opposite to the first side of the first substrate, wherein the second substrate comprises a micro-electric element, a dam and a plurality of second conductive pads corresponding to the plurality of first conductive pads, and wherein the plurality of second conductive pads are disposed on a first side of the second substrate and between the first substrate and the second substrate;
forming a redistribution layer on a second side opposite to the first side of the second substrate, wherein the redistribution layer penetrates the second substrate, the plurality of second conductive pads and the first substrate and extends into the plurality of first conductive pads to electrically connect the plurality of first conductive pads and the plurality of second conductive pads without extending into the dam; and
forming an insulating layer on the second side of the second substrate to cover the redistribution layer, wherein the insulating layer penetrates the second substrate, the plurality of second conductive pads and the first substrate to extend into the plurality of first conductive pads, and wherein the insulating layer further extends to penetrate the plurality of first conductive pads.

\* \* \* \* \*